United States Patent
Tomita

(10) Patent No.: US 7,443,220 B2
(45) Date of Patent: Oct. 28, 2008

(54) PHASE SHIFT CIRCUIT AND PHASE CORRECTING METHOD

(75) Inventor: Kazuhiro Tomita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/602,320

(22) Filed: Nov. 21, 2006

(65) Prior Publication Data
US 2007/0075805 A1    Apr. 5, 2007

Related U.S. Application Data

(63) Continuation of application No. PCT/JP2004/010030, filed on Jul. 14, 2004.

(51) Int. Cl.
*H03H 11/16* (2006.01)
(52) U.S. Cl. .................. 327/233; 327/235
(58) Field of Classification Search .......... None
See application file for complete search history.

(56) References Cited

U.S. PATENT DOCUMENTS

| 6,211,708 B1 * | 4/2001 | Klemmer .................... 327/122 |
| 2004/0100315 A1 * | 5/2004 | Hyoung et al. .............. 327/233 |

FOREIGN PATENT DOCUMENTS

| EP | 1 317 065 A1 | 6/2003 |
| JP | 5-110369 | 4/1993 |
| JP | 7-303028 | 11/1995 |
| JP | 9-93080 | 4/1997 |
| JP | 9-307600 | 11/1997 |
| JP | 10-313231 | 11/1998 |
| JP | 11-284490 | 10/1999 |
| JP | 2004-180098 | 6/2004 |
| WO | WO 02/17485 A1 | 2/2002 |

OTHER PUBLICATIONS

Form PCT/IB/308308, Second and Supplementary Notice Informing the Applicant of the Communication of the International Application (To Designated Offices Which Apply The 30 Month Time Limit Under Article 22(1)), mailed Nov. 16, 2006 for PCT/JP2004/010030.
PCT International Preliminary Report on Patentability (Chapter I) (Form PCT/IB/338)), mailed Feb. 8, 2007 and issued in corresponding PCT Application No. PCT/JP2004/010030 with Notice of Transmission of Cover Page.

(Continued)

*Primary Examiner*—Cassandra Cox
(74) *Attorney, Agent, or Firm*—Staas & Halsey LLP

(57) ABSTRACT

A phase shift circuit includes a 45° phase corrector that performs vector synthesis of signals supposed to have a 45° phase difference, out of a plurality of sets of orthogonal phase signals having an about 45° phase difference and an equal amplitude, the orthogonal phase signals in each set having undergone 90° phase correction, and outputs signals resulting from the vector synthesis, whereby a phase error between the orthogonal phase signals in the different sets is eliminated by the vector synthesis to make it possible to correct their phase difference to accurately 45°.

18 Claims, 7 Drawing Sheets

OTHER PUBLICATIONS

International Search Report (Form PCT/ISA/210) of International Application No. PCT/JP2004/010030, Date of Mailing of the International Search Report: Oct. 26, 2004. (5pp).

Takafumi Yamaji et al., "An I/Q Active Balanced Harmonic Mixer with IM2 Cancelers and a 45° Phase Shifter", *IEEE Journal of Solid-State Circuits*, vol. 33, No. 12, Dec. 1998, pp. 2240-2246.

Mitsuhiro Shimozawa et al., "A Monolithic Even Harmonic Quadrature Mixer Using a Balance Type 90 Degree Phase shifter for Direct Conversion Receivers", *1998 IEEE MTT-S Digest*, 1998, TU3B-3, pp. 175-178.

\* cited by examiner

F I G. 5
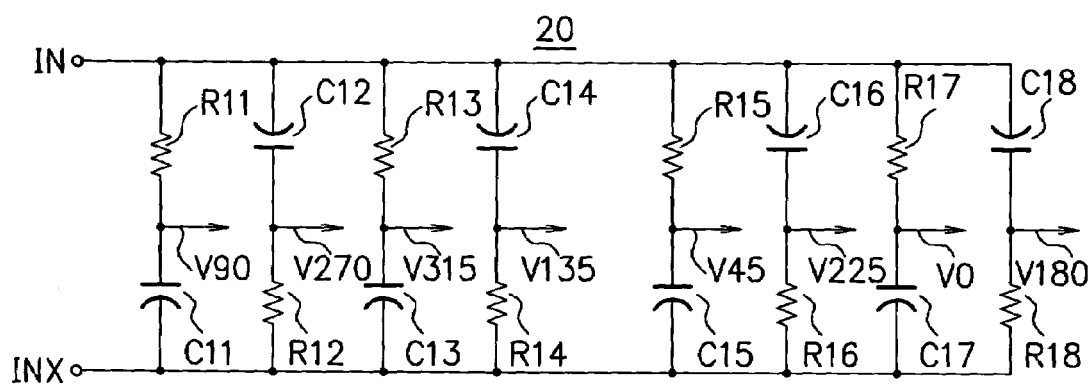
F I G. 6
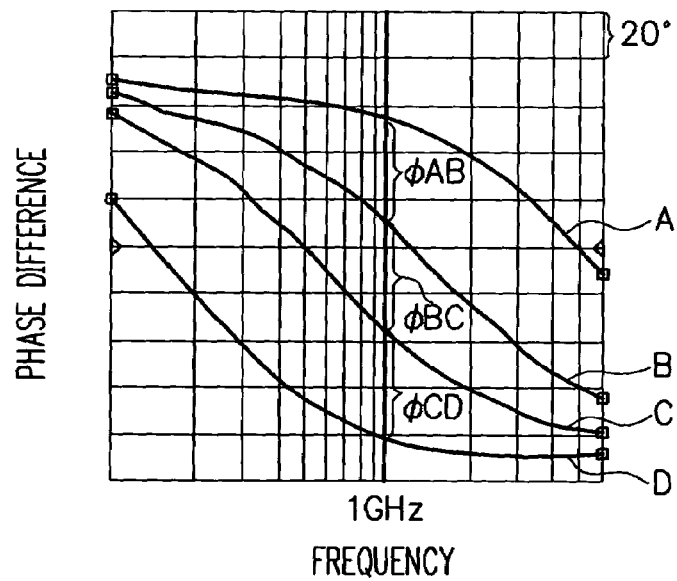

ic mixer can realize cost
PHASE SHIFT CIRCUIT AND PHASE CORRECTING METHOD

This application is a continuing application, filed under 35 U.S.C. §111(a), of International Application PCT/JP2004/010030, filed Jul. 14, 2004, the contents of which are incorporated herein by reference.

TECHNICAL FIELD

The present invention relates to a phase shift circuit and a phase correcting method, more particularly, to those suitably applied to a 45° phase shift circuit that generates a plurality of signals having a 45° phase difference.

BACKGROUND ART

In a receiver and the like for wireless communication such as mobile communication, a direct conversion (zero IF) method is a desirable reception method. Being simple in circuit configuration and requiring no IF (Intermediate Frequency) filter, the direct conversion method can realize cost reduction.

However, a typical direct conversion receiver that has been conventionally used mixes local oscillation signals having the same frequency as that of an inputted high-frequency signal (reception signal) to take out a desired low-frequency signal. Consequently, a DC offset occurs due to local self-mixing using the signals with the same frequency, and by this DC offset, a subsequent-stage circuit may possibly be saturated to stop its operation.

One method to avoid this problem is a method of using an even harmonic mixer in order to reduce the occurring DC offset. The even harmonic mixer reduces a DC offset by using, as local oscillation signals, signals having a ½ frequency of a frequency of a reception signal and having a 90° phase difference from (orthogonal to) each other, that is, by using the local oscillation signals different in frequency from the reception signal.

FIG. 11 is a diagram showing the configuration of the even harmonic mixer.

In FIG. 11, a down converter 61 receives a reception signal (high-frequency signal) RFIN and local oscillation signals LO0, LO90 and mixes them to output an I-channel signal ICH. Similarly, a down converter 62 receives the reception signal RFIN and local oscillation signals LO45, LO135 and mixes them to output a Q-channel signal QCH.

A phase shift circuit 63 generates and outputs the local oscillation signals LO0, LO90, LO45, LO135 based on a signal LOI whose frequency is ½ of a frequency of the signal RFIN. Among the local oscillation signals LO0, LO90, LO45, LO135 in which the signals LO0 and LO90 constitute one set and the signals LO45 and LO135 constitute one set, signals in the same set have a 90° phase difference and corresponding signals in different sets have a 45° phase difference.

As a 45° phase shifter generating signals having a 45° phase difference, that using a CR network constituted of resistors (R) and capacitors (C) has been known (see, for example, a non-patent document 1).

FIG. 12 is a diagram showing a configuration example of a primary CR-type 45° phase shifter 64 using a CR network. In FIG. 12, the primary CR-type 45° phase shifter 64 having resistors R61~R64 and capacitors C61~C64 is shown as an example.

As shown in FIG. 12, in the primary CR-type 45° phase shifter 64, circuits each constituted of one resistor and one capacitor connected in series are connected in parallel between signals lines of input signals IN, INX. Resistance values of the resistors R61 and R63 are equal to each other and resistance values of the resistors R62 and R64 are equal to each other. Further, capacitance values of the capacitors C61 and C63 are equal to each other and capacitance values of the capacitors C62 and C64 are equal to each other.

By appropriately designing the resistance values of the resistors R61~R64 and the capacitance values of the capacitors C61~C64, signals OUT0, OUT180, OUT45, and OUT225 whose phases are deviated (whose phases are rotated) from phases of the input signals by predetermined amounts are outputted from respective junctions between the resistors and the capacitors connected in series. For example, the signal OUT0 is outputted from a circuit constituted of the resistor R61 and the capacitor C61, and the signal OUT45 having a 45° phase difference from the signal OUT0 is outputted from a circuit constituted of the resistor R62 and the capacitor C62.

FIG. 13 is a chart showing a frequency characteristic of a phase difference in the primary CR-type 45° phase shifter shown in FIG. 12, the horizontal axis showing frequency and the vertical axis showing phase difference (in a unit of degree) from a reference signal. FIG. 13 shows a frequency characteristic in which a frequency (center frequency) corresponding to a phase difference of 45° is set to 1 GHz.

In the primary CR-type phase shifter 64, a phase difference (a rotation amount of a phase) of a signal for a given frequency is determined by the resistance value of the resistor and the capacitance value of the capacitor constituting the phase shifter. Therefore, even if the primary CR-type 45° phase shifter 64 is designed so that a desired frequency characteristic is obtained, the resistance values of the resistors and the capacitance values of the capacitors are actually influenced by manufacturing (process) variation and parasitic components, so that a 45° phase difference cannot be obtained, or a phase error occurs because the frequency for which the phase difference becomes 45° is shifted. For example, if an about 3° phase error is allowed in a primary CR-type 45° phase shifter having the frequency characteristic shown in FIG. 13, a frequency range becomes about 700 MHz~1500 MHz, which cannot be said to be sufficient considering actual manufacturing variation and so on.

Further, in the even harmonic mixer, phase shift accuracy relating to the local oscillation signals supplied to the down converters 61, 62 (accuracy of a phase difference between the oscillation signals) directly and greatly influences quality of the reception signal. Therefore, in order to improve performance of the even harmonic mixer to enable high-quality data communication, there is a demand for improving accuracy of 45° phase difference signals. However, in a conventional method, it is extremely difficult to constantly obtain sufficient accuracy of a phase difference of signals over a wide band, due to manufacturing variation or the like of resistors and capacitors constituting a phase shifter or the like.

Incidentally, regarding orthogonal phase signals (90° phase difference signals), proposed is a method of eliminating a phase error by 90° phase correction (for example, see a patent document 1). However, this method cannot be applied directly to 45° phase difference signals.

Patent document 1: Japanese Patent Application Laid-open No. Hei 5-110369 Non-patent document 1: T. Yamaji, H. Tanimoto, and H. Kokatsu, "An I/Q Active Balanced Harmonic Mixer with IM2 Cancelers and a 45° Phase Shifter", IEEE Journal OF SOLID-STATE CIRCUITS, VOL. 33, NO. 12, pp. 2240-2246, DECEMBER 1998

SUMMARY OF THE INVENTION

It is an object of the present invention to provide a phase shift circuit outputting a plurality of signals accurately having a 45° phase difference, and a phase correcting method.

A phase shift circuit of the present invention includes a 45° phase corrector that performs vector synthesis of signals which are supposed to have a 45° phase difference, out of a plurality of sets of supplied orthogonal phase signals having an about 45° phase difference and an equal amplitude, the orthogonal phase signals in each set having undergone 90° phase correction, and outputs signals resulting from the vector synthesis.

According to the present invention, by the vector synthesis of the respective first and second signals of a first set of orthogonal signals which are supposed to have a 45° phase difference relative to respective first and second signals of a second set, out of the plural sets of orthogonal phase signals having undergone the 90° phase correction, it is possible to eliminate a phase error between the respective first and second signals of the orthogonal phase signals of the different sets, to correct their phase difference to an accurate 45°.

BRIEF DESCRIPTION OF THE DRAWINGS

FIG. 5 is a diagram showing another configuration example of a 45°/90° phase shifter.

FIG. 6 is a chart showing an example of a phase shift characteristic of the 45°/90° phase shifter shown in FIG. 5.

DETAILED DESCRIPTION OF THE PREFERRED EMBODIMENTS

Hereinafter, embodiments of the present invention will be described based on the drawings.

Figure 1:
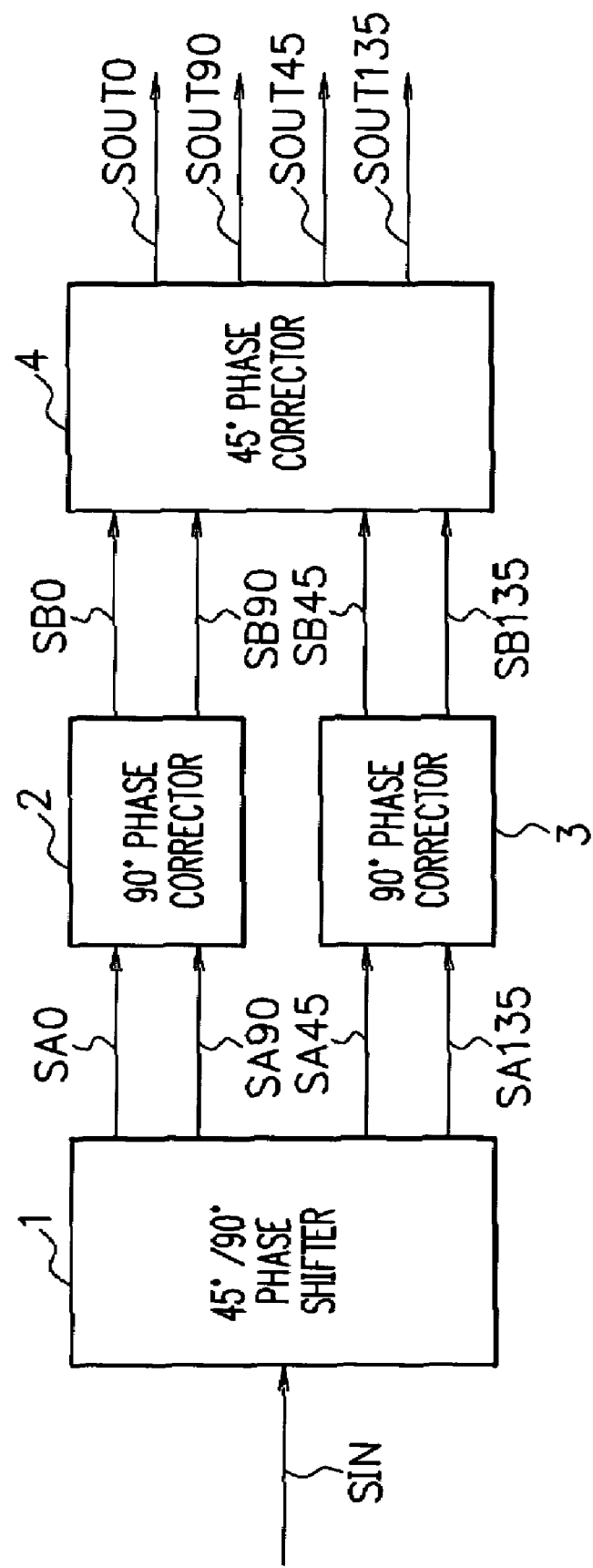
FIG. 1 is a principle explanatory diagram of a 45° phase shift circuit in an embodiment of the present invention.

FIG. 1 is a principle explanatory diagram of a 45° phase shift circuit in an embodiment of the present invention. The 45° phase shift circuit has a 45°/90° phase shifter 1, 90° phase correctors 2, 3, and a 45° phase corrector 4.

The 45°/90° phase shifter 1 receives an input signal SIN and outputs a 0° signal SA0, a 45° signal SA45, a 90° signal SA90, and a 135° signal SA135. The signals SA0, SA45, SA90, and SA135 are signals having 0°, 45°, 90°, and 135° relative phase differences from a reference signal respectively, and are generated based on the input signal SIN. That is, the signals SA0, SA45, SA90, and SA135 are four-phase signals having successive 45° phase differences therebetween, and constitute two sets of orthogonal phase signals, the 0° signal SA0 and the 90° signal SA90 constituting (i.e., a first) set and the 45° signal SA45 and the 135° signal SA135 constituting one (i.e., second) set, and the respective first and second signals of the two sets of orthogonal phase signals (i.e., SB0 relative to SB45 and SB 90 relative to SB135) having a 45° phase difference therebetween (the phase difference need not be accurately 45° but may be about 45°). Incidentally, the phase shifter 1 may output 8-phase signals further including reverse-phase signals of the respective signals (signals having 180°, 225°, 270°, and 315° relative phase differences).

The 90° phase correctors 2, 3 perform 90° phase correction of the orthogonal phase (90° phase difference) signals outputted from the 45°/90° phase shifter 1. By the 90° phase correction, the phase difference between the two signals constituting each set of the orthogonal phase signals is corrected to accurately 90°, and a conventionally known 90° phase correcting method is applied thereto.

For example, the addition or subtraction of the two signals constituting each set of the orthogonal phase signals (vector synthesis using the two signals) enables the 90° phase correction (see Japanese Patent Application Laid-open No. Hei 5-110369 and so on). Another possible method of the 90° phase correction is, for example, to use a phase correction loop by 90° phase detection (see Japanese Patent Application Laid-open No. Hei 7-303028 and so on).

Concretely, the 90° phase corrector 2 receives the 0° signal SA0 and the 90° signal SA90 that are supposed to have 0° and 900 relative phase differences, and performs the 90° phase correction by using these signals to generate and output a 0° signal SB0 and a 90° signal SB90 with corrected phases. Similarly, the 90° phase corrector 3 receives the 45° signal SA45 and the 135° signal SA135 that are supposed to have 45° and 135° relative phase differences to output a 45° signal SB45 and a 135° signal SB135 having undergone the 90° phase correction.

Incidentally, after performing the 90° phase correction, the 90° phase correctors 2, 3 further perform amplitude limiting (limiting, amplitude correction) in order to equalize amplitudes of the respective signals. Therefore, the amplitudes of the signals SB0, SB45, SB90, and SB135 outputted from the 90° phase correctors 2, 3 are mutually equal.

The 45° phase corrector 4 performs 45° phase correction to correct a phase difference, of signals having an about 45° phase difference to an accurate 45°. The 45° phase corrector 4 receives the 0° signal SB0, the 90° signal SB90, the 45° signal SB45, and the 135° signal SB135 constituting the two sets of orthogonal phase signals having undergone the 90° phase correction in the 90° phase correctors 2, 3. Then, the 45° phase corrector 4 performs the 45° phase correction of these signals to output a 0° signal SOUT0, a 90° signal SOUT90, a 45° signal SOUT45, and a 135° signal SOUT135 accurately having successive, accurate 45° phase differences therebetween.

Incidentally, similarly to the 90° phase correctors 2,3, after performing the 45° phase correction, the 45° phase corrector 4 performs amplitude limiting (amplitude correction) in order to eliminate amplitude errors (amplitude differences among the signals) caused by the phase correction. Therefore, the amplitudes of the signals SOUT0, SOUT90, SOUT45, and SOUT135 are mutually equal.

Figure 2:
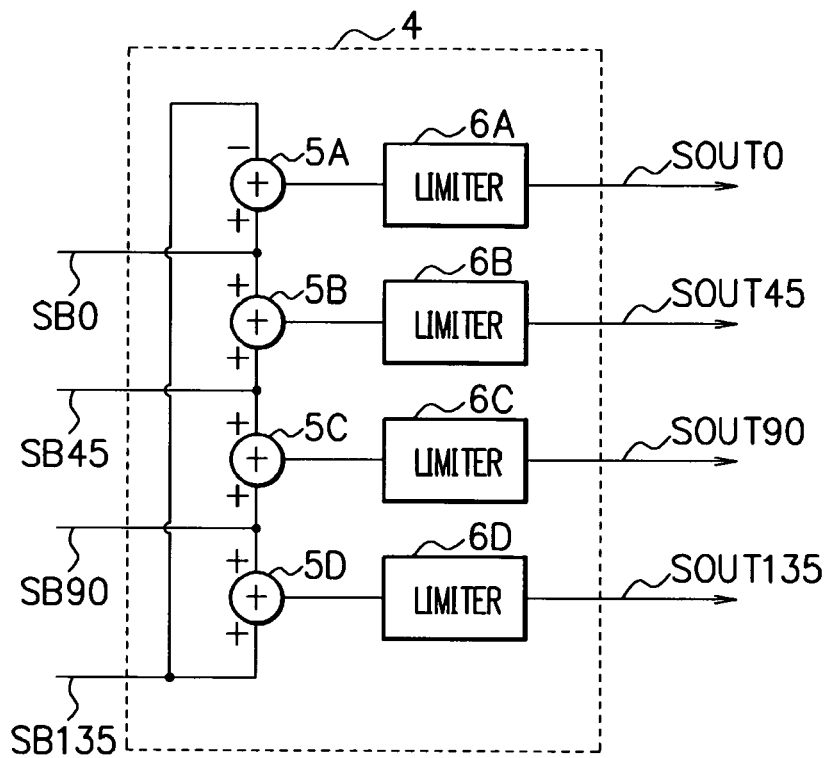
FIG. 2 is a diagram showing the configuration of a 45° phase corrector shown in FIG. 1.

The internal configuration of the 45° phase corrector 4 is shown in FIG. 2.

FIG. 2 is a diagram showing the configuration of the 45° phase corrector 4.

The 45° phase corrector 4 has a plurality of adders 5 and limiter amplifiers (limiter circuits) 6 provided in correspondence to the adders 5. Each of the adders 5 adds two input signals, such as, for example, the 0° signal SB0 and the 45° signal SB45, which are supposed to have a mutual phase difference of 45°, and outputs the calculation result to the limiter amplifier 6. The limiter amplifiers 6 perform the amplitude limiting to correct amplitude errors among the signals supplied from the adders 5.

Concretely, an adder 5A receives the 0° signal SB0 and the 135° signal SB135 with a reversed phase (a reverse-phase signal of the 135° signal SB135) and calculates a difference between the 00 signal SB0 and the 135° signal SB135 to output the calculation result to a limiter amplifier 6A. Further, an adder 5B receives the 0° signal SB0 and the 45° signal SB45 and calculates the sum of the 0° signal SB0 and the 45° signal SB45 to output the calculation result to a limiter amplifier 6B. Similarly, adders 5C, 5D calculate the sum of the 45° signal SB45 and the 90° signal SB90 and the sum of the 90° signal SB90 and the 135° signal SB135 to output the calculation results to limiter amplifiers 6C, 6D respectively.

The limiter amplifiers 6A~6D perform the amplitude correction of the signals supplied from the corresponding adders 5A~5D so as to equalize the amplitudes of the signals SOUT0, SOUT45, SOUT90, and SOUT135 which are to be outputted therefrom, and output the resultant signals.

Figure 3:
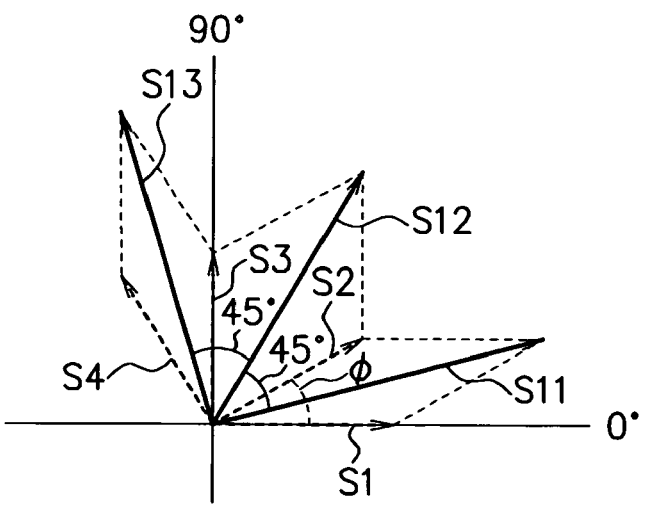
FIG. 3 is a chart for explaining the principle of 45° phase correction by the 45° phase corrector in this embodiment.

FIG. 3 is a chart for explaining the principle of the 45° phase correction by the 45° phase corrector 4.

In FIG. 3, signals (vectors) S1~S4 are the orthogonal phase signals which are inputted to the 45° phase corrector 4 after undergoing the 90° phase correction, the signals S1 and S3 constituting first orthogonal phase signals and the signals S2 and S4 constituting second orthogonal phase signals. For example, as for the correspondence to the signals SB0, SB45, SB90, and SB135 shown in FIG. 2, the signal S1 corresponds to the 0° signal SB0, the signals S2, S3, and S4 correspond to the 45° signal SB45, the 90° signal SB90, and the 135° signal SB135, respectively.

$\phi$ is an actual phase difference between the signals S1 and S2 (a phase difference between the first orthogonal phase signal and the second orthogonal phase signal) and is ideally 45°. Therefore, this phase difference is expressed as $\phi=45+\alpha$ (°), where $\alpha$ is a phase error of the first orthogonal phase signal and the second orthogonal phase signal.

A signal S11 is generated by the vector synthesis of the signals S1 and S2. Signals S12 and S13 are generated by the vector synthesis of the signals S2 and S3 and by the vector synthesis of the signals S3 and S4 respectively. That is, the signals S11~S13 correspond to the signals that are obtained when the 45° phase corrector 4 adds the signals supposed to have a 45° mutual phase difference.

A phase difference $\Delta\theta1(°)$ between the signals S11 and S12 generated by the vector synthesis of the signals S1 and S2 supposed to have a 45° phase difference and by the vector synthesis of the signals S2 and S3 supposed to have a 45° phase difference is expressed as:

$$\Delta\theta1=\phi+(90-\phi)/2-\phi/2=45 \tag{1}$$

Similarly, a phase difference $\Delta\theta2(°)$ between the signals S12 and S13 is expressed as:

$$\Delta\theta2=90+\phi/2-[\phi+(90-)/2]=45 \tag{2}$$

Therefore, as is apparent from the above expressions (1), (2), a mutual phase difference among the output signals having undergone the 45° phase correction by the 45° phase corrector 4 has a corrected mutual phase difference, which is accurately 45° irrespective of a value of $\phi$. That is, if, in the two sets of the orthogonal phase signals inputted to the 45° phase corrector 4, a phase difference between the two signals constituting each set of the orthogonal phase signals is accurately 90° (if the phase difference has high accuracy), the 45° phase corrector 4 is capable of eliminating a phase error to perform the 45° phase correction with high accuracy.

As described above, the 45° phase corrector 4 in this embodiment performs the 45° phase correction for eliminating phase errors to correct the phase difference to accurately 45°, by adding the two signals supposed to have a 45° mutual phase difference, out of two sets of orthogonal phase signals having an about 45° phase difference (may include a phase error or need not include a phase error) and an equal amplitude, the orthogonal phase signals in each set having undergone the 90° phase correction, in other words, by performing the vector synthesis using the two signals.

First Embodiment

Figure 4:
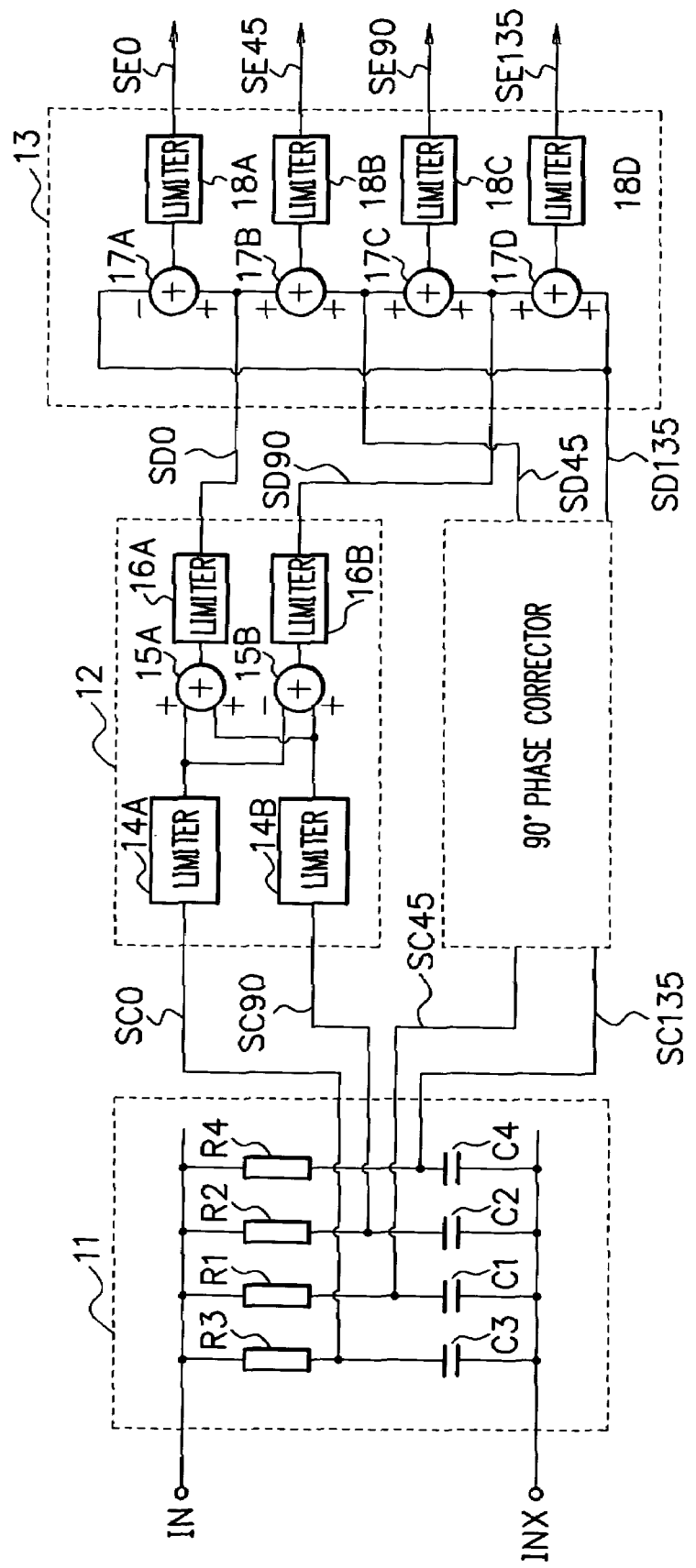
FIG. 4 is a diagram showing a configuration example of a 45° phase shift circuit in a first embodiment.

FIG. 4 is a view showing a configuration example of a 45° phase shift circuit in a first embodiment of the present invention. The 45° phase shift circuit has a 45°/90° phase shifter 11, two 90° phase correctors 12, and a 45° phase corrector 13.

The 45°/90° phase shifter 11 is a primary CR-LPF type 45°/90° phase shifter for phase-shifting an input signal by an integral multiple of 45°, and receives differential input signals IN, INX to output a 0° signal SC0, a 45° signal SC45, a 90° signal SC90, and a 135° signal SC135 supposed to have 0°, 45°, 90°, and 135° relative phase differences respectively at a center frequency $f_0$. That is, the 45°/90° phase shifter 11 receives the differential input signals IN, INX to output the four-phase signals SC0, SC45, SC90, and SC135 with the frequency $f_0$, having a phase difference of about 45°.

The 45°/90° phase shifter 11 is constituted of a CR network including resistors R1~R4 and capacitors C1~C4, and circuits each constituted of one resistor Ri and one capacitor Ci (i=any integer out of 1~4) which are connected in series are connected in parallel between signal lines through which the differential input signals IN, INX are inputted. Each of the signals SC0, SC45, SC90, and SC135 is outputted from a junction of the one resistor Ri and the one capacitor Ci.

Here, resistance values and capacitance values of the resistors R1~R4 and the capacitors C1~C4 constituting the 45°/90° phase shifter 11 are determined based on the following expressions (3), (4).

These values can be selected so that a ratio calculated by the expression (3) holds regarding a 45° phase difference output, and a ratio calculated by the expression (4) holds regarding a 135° phase difference output:

$$R1/(1/\omega_0 C1)=(1/\omega_0 C2)/R2=\tan(180-45)/4 \tag{3}$$

$$R3/(1/\omega_0 C3)=(1/\omega_0 C4)/R4=\tan(180-45)/4 \tag{4}$$

In the above expressions (3), (4), $\omega_0=2\pi \times f_0$.

Incidentally, instead of the 45°/90° phase shifter 11 shown in FIG. 4 that outputs the 4-phase signals of the 0° signal SC0, the 45° signal SC45, the 90° signal SC90, and the 135° signal SC135 having an about 45° phase difference, usable is a 45°/90° phase shifter 20 shown in FIG. 5 that outputs 8-phase signals further including reverse-phase signals (signals having 180°, 225°, 270°, and 315° relative phase differences) of the respective signals.

FIG. 5 is a diagram showing another configuration example of a 45°/90° phase shifter. The 45°/90° phase shifter 20 shown in FIG. 5 is a primary CR-LPF type 45°/90° phase shifter that is designed to output 8-phase signals with, for example, a 1 GHz center frequency $f_0$, having an about 45° phase difference.

The 45°/90° phase shifter 20 is constituted of a CR network in which circuits each constituted of one resistor Ri and one capacitor Ci (i=any integer out of 11~18) connected in series are connected in parallel between signal lines through which differential input signals IN, INX are inputted. Each of 8-phase signals V0, V45, V90, V135, V180, V225, V270, and V315 supposed to have a 45° phase difference and exhibiting a phase shift characteristic shown in FIG. 6 is outputted from a junction of the resistor Ri and the capacitor Ci. In FIG. 6, the horizontal axis shows frequency and the vertical axis shows phase difference (20° per graduation) from an input signal, and each of φAB, φBC, φCD is a phase difference of any two output signals supposed to have a 45° phase difference out of the 8-phase signals.

Returning to FIG. 4, the 90° phase correctors 12 perform 90° phase correction of orthogonal phase signals consisting of two signals supposed to have a 90° mutual phase difference, out of the signals SC0, SC45, SC90, and SC135 outputted from the 45°/90° phase shifter 11. Concretely, one of the 90° phase correctors 12 receives the 0° signal SC0 and the 90° signal SC90 and outputs a 0° signal SD0 and a 90° signal SD90 resulting from the 90° phase correction that uses the 0° signal SC0 and the 90° signal SC90. Similarly, the other 90° phase corrector 12 receives the 45° signal SC45 and the 135° signal SC135 to output a 45° signal SD45 and a 135° signal SD135 resulting from the 90° phase correction that uses the 45° signal SC45 and the 135° signal SC135.

Each of the 90° phase correctors 12 has four limiter amplifiers 14A, 14B, 16A, 16B and two adders 15A, 15B.

The limiter amplifiers 14A, 14B perform amplitude limiting of the two signals constituting the orthogonal phase signals supplied from the 45°/90° phase shifter 11 in order to equalize their amplitudes by correcting an amplitude error therebetween.

The adders 15A, 15B receive the orthogonal phase signals having undergone the correction of the amplitude error in the limiter amplifiers 14A, 14B and output a sum signal and a difference signal of the two signals constituting the orthogonal phase signals.

Here, the adder 15A receives the two signals constituting the orthogonal phase signals as they are and adds these signals to output the sum signal regarding the orthogonal phase signals. On the other hand, the adder 15B receives one of the two signals constituting the orthogonal phase signals with an unchanged phase and receives the other signal with a reversed phase (reverse-phase input) and adds these signals to output a difference signal regarding the orthogonal phase signals.

The limiter amplifiers 16A, 16B perform the amplitude limiting of the output signals of the adders 15A, 15B in order to correct an amplitude error caused by the 90° phase correction and equalize the amplitudes of the output signals.

Figure 7:
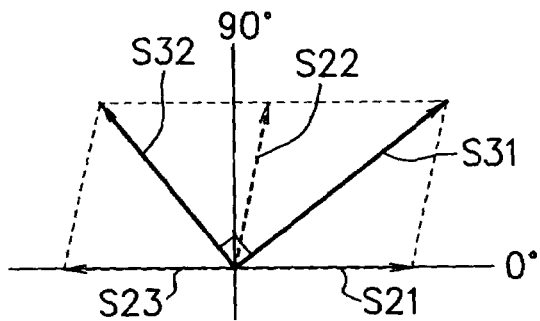
FIG. 7 is a chart for explaining the principle of 90° phase correction by a 90° phase corrector.

FIG. 7 is a chart for explaining the principle of the 90° phase correction by the 90° phase corrector 12.

In FIG. 7, signals (vectors) S21~S23 are the orthogonal phase signals inputted to the adders 15A, 15B of the 90° phase corrector 12, out of which the signal S23 is a reverse-phase signal resulting from the phase reverse of the signal S21. A signal S31 is generated by the vector synthesis of the signals S21 and S22. A signal S32 is generated by the vector synthesis of the signals S22 and S23.

As is apparent from FIG. 7, if the amplitudes of the signals S31, S32, and S33 are equal, an accurately 90° phase difference is obtained as a phase difference of the signals (the sum signal and the difference signal of the orthogonal phase signals) S31 and S32 generated by the vector syntheses of the signals S21 and S22 and the signals S22 and S23, all of which constitute the orthogonal phase signals and out of which the signals in each set is supposed to have a 90° phase difference.

According to the principle of the 90° phase correction shown in FIG. 7, the 90° phase corrector 12 performs the 90° phase correction of the inputted orthogonal phase signals by the vector synthesis and outputs the generated signals as the orthogonal phase signals having undergone the 90° phase correction.

Returning to FIG. 4, the 45° phase corrector 13 performs 45° phase correction to correct a phase difference of signals having an about 45° phase difference to accurately 45° and performs amplitude limiting in order to eliminate amplitude errors caused by the phase correction.

The 45° phase corrector 13 has a plurality of adders 17A~17D and limiter amplifiers 18A~18D provided in correspondence to the adders 17A~17D. In the 45° phase corrector 13, the adders 17A~17D and the limiter amplifiers 18A~18D correspond to the adders 5A~5D and the limiter amplifiers 6A~6D of the 45° phase corrector 4 shown in FIG. 2 respectively, and the 45° phase corrector 13 has the same configuration as that of the 45° phase corrector 4 shown in FIG. 2, and therefore, detailed description thereof will be omitted.

In short, the 45° phase corrector 13 performs 45° phase correction by vector synthesis using two sets of orthogonal phase signals having an about 45° phase difference and an equal amplitude, the orthogonal phase signals in each set having undergone 90° phase correction, thereby correcting the phase difference to accurately 45°.

Figure 8:
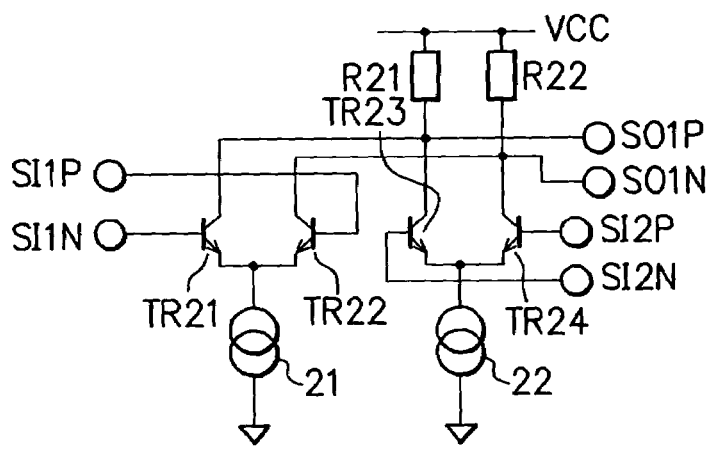
FIG. 8 is a diagram showing a configuration example of an adder in the embodiment of the present invention.

Here, FIG. 8 shows a configuration example of the adders 15A, 15B, 17A~17D each of which performs the vector synthesis of the two signals and outputs the sum signal or the difference signal of the two signals in the 90° phase correctors 12 and the 45° phase corrector 13 shown in FIG. 4.

FIG. 8 is a circuit diagram showing a configuration example of an analog adder. The adder has NPN transistors TR21~TR24, resistors R21, R22, and current sources 21, 22.

Collectors of the NPN transistors TR21, TR22 are connected to a power source VCC via the resistors R21, R22 respectively. Emitters of the NPN transistors TR21, TR22 are coupled to each other and connected to a ground GND via the current source 21. Bases of the NPN transistors TR21, TR22 are connected to input terminals SI1N, SI1P to which a first input signal (differential signal) is inputted.

Similarly, collectors of the NPN transistors TR23, TR24 are connected to the power source VCC via the resistors R21, R22. Emitters of the NPN transistors TR23, TR24 are coupled to each other and connected to the ground GND via the current source 22. Bases of the NPN transistors TR23, TR24 are connected to input terminals SI2N, SI2P to which a second input signal (a differential signal) is inputted.

An output terminal SO1P is connected to a junction of the collectors of the NPN transistors TR21, TR23 and the resistor R21. An output terminal SO1N is connected to a junction of the collectors of the NPN transistors TR22, TR24 and the resistor R22.

The adder thus constituted of the two-input differential amplifiers realizes an addition function in the collector parts of the NPN transistors TR21, TR23 by being applied with currents based on voltages of the first and second input signals inputted via the input terminals SI1N, SI2N. Similarly, the first and second input signals inputted via the input terminals SI1P, SI2P are added in the collector parts of the NPN transistors TR22, TR24.

Figure 9:
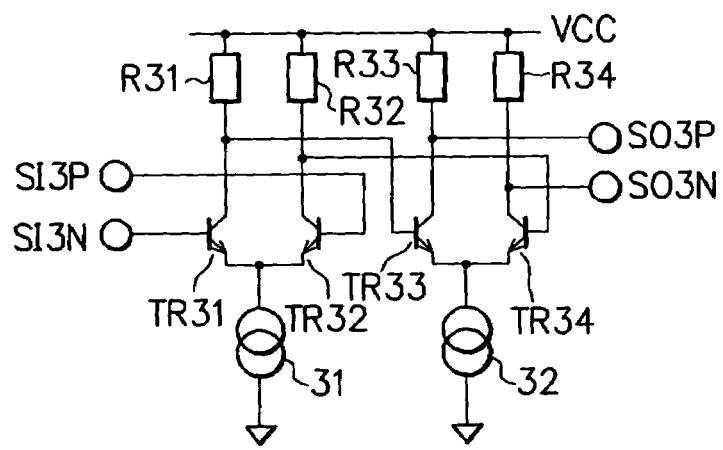
FIG. 9 is a diagram showing a configuration example of a limiter amplifier in the embodiment of the present invention.

Further, FIG. 9 shows a configuration example of the limiter amplifiers 14A, 14B, 16A, 16B, 18A~18D that perform the amplitude limiting in the 90° phase correctors 12 and the 45° phase corrector 13 shown in FIG. 4.

FIG. 9 is a circuit diagram showing a configuration example of a limiter amplifier (limiter circuit). The limiter amplifier has NPN transistors TR31~TR34, resistors R31~R34, and current sources 31, 32.

Collectors of the NPN transistors TR31, TR32 are connected to a power source VCC via the resistors R31, R32 respectively. Emitters of the NPN transistors TR31, TR32 are coupled to each other and are connected to a ground GND via the current source 31. Bases of the NPN transistors TR31, TR32 are connected to input terminals SI3N, SI3P to which an input signal (differential signal) is inputted.

Collectors of the NPN transistors TR33, TR34 are connected to the power source VCC via the resistors R33, R34 respectively. Emitters of the NPN transistors TR33, TR34 are coupled to each other and are connected to the ground GND via the current source 32. A base of the NPN transistor TR33 is connected to a junction of the collector of the NPN transistor TR31 and the resistor R31, and a base of the NPN transistor TR34 is connected to a junction of the collector of the NPN transistor TR32 and the resistor R32.

An output terminal SO3P is connected to a junction of the collector of the NPN transistor TR33 and the resistor R33. An output terminal SO3N is connected to a junction of the collector of the NPN transistor TR34 and the resistor R34.

As shown in FIG. 9, the limiter amplifier is constituted of multi-stage differential amplifiers connected to one another. Incidentally, in the above description, the limiter amplifier constituted of the two differential amplifiers is shown as an example, but this is not restrictive, and the number of stages of connected differential amplifiers may be any and can be appropriately determined according to a gain and the like.

As described above, according to the first embodiment, the 45°/90° phase shifter 11 generates and outputs the signals SC0, SC45, SC90, and SC135 supposed to have 0°, 45°, 90°, and 135° relative phase differences by phase-shifting the input signals IN, INX. The 90° phase correctors 12 perform the 90° phase correction of one set of orthogonal phase signals consisting of the signals SC0 and SC90 and one set of the orthogonal phase signals consisting of the signals SC45 and SC135 to output the signals SD0, SD45, S90, and SD135.

Further, the 45° phase corrector 13 performs 45° phase correction in such a manner that the adders 17 perform the vector synthesis of the respective sets of signals supposed to have a 45° phase difference, by using the signals SD0, SD45, SD90, and SD135 (two sets of the orthogonal phase signals having an about 45° phase difference) that have undergone the 90° phase correction, thereby eliminating phase errors. Then, it performs amplitude limiting of the signals generated by the vector synthesis to output the signals SE0, SE45, SE90, and SE135.

Consequently, by performing the vector synthesis of the signals supposed to have a 45° phase difference, out of the orthogonal phase signals as shown in FIG. 3, it is possible to eliminate the phase errors among the orthogonal phase signals having an about 45° phase difference. Therefore, even if phase errors occur in 45° phase difference signals due to manufacturing variation and the like of the resistors R1~R4 and the capacitors C1~C4 and so on constituting the 45°/90° phase shifter 11, it is possible to surely eliminate the phase errors, thereby alleviating the influence of the manufacturing variation and the like, which makes it possible to correct a phase difference of the 45° phase difference signals to accurately 45° and to constantly obtain sufficient accuracy in a wide band. In addition, the 45° phase correction in this embodiment makes it possible to widen a frequency range usable for 45° phase difference signals having a 45° phase difference.

Second Embodiment

Next, a second embodiment will be described.

Figure 10:
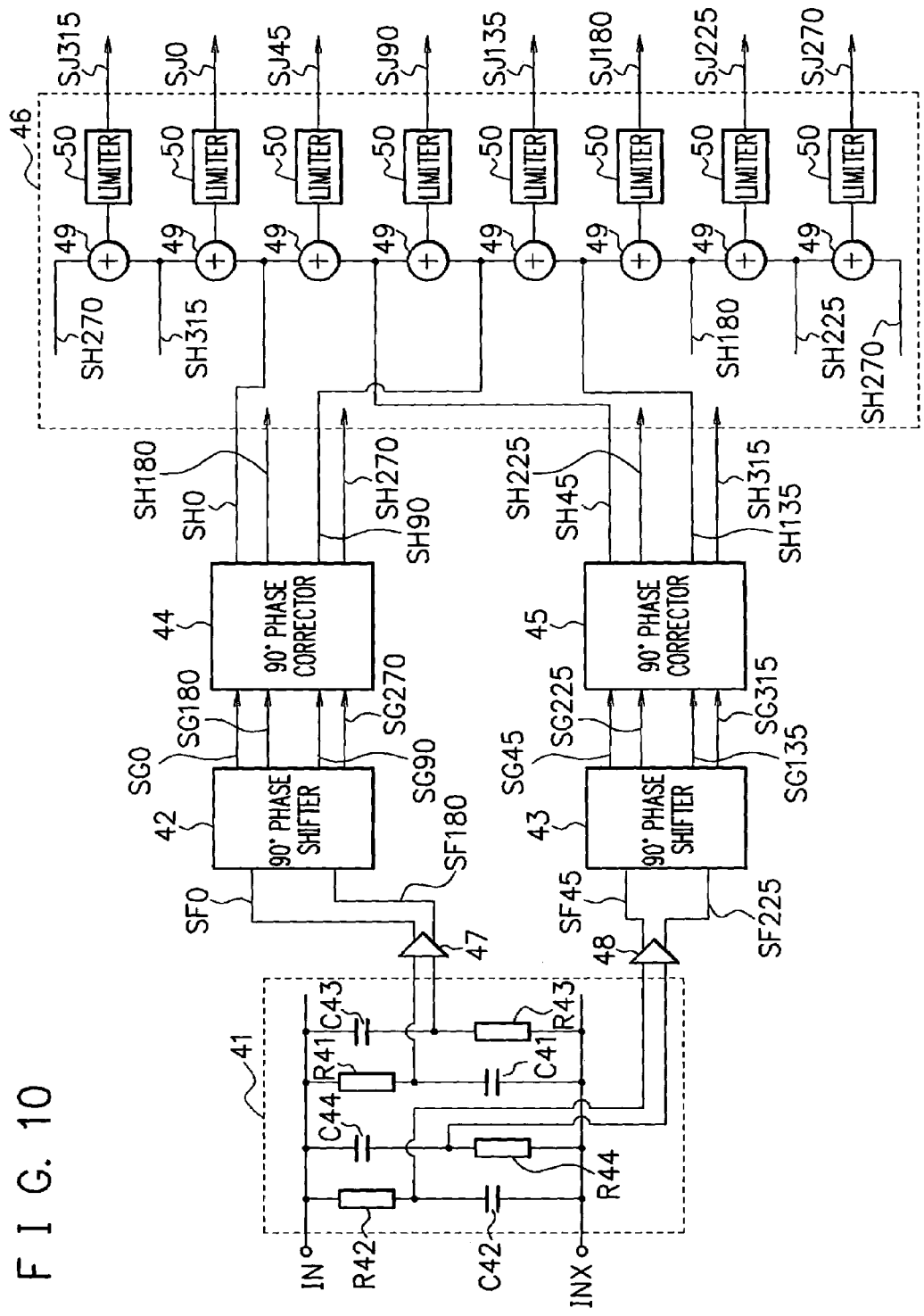
FIG. 10 is a diagram showing a configuration example of a 45° phase shift circuit in a second embodiment.
Figure 11:
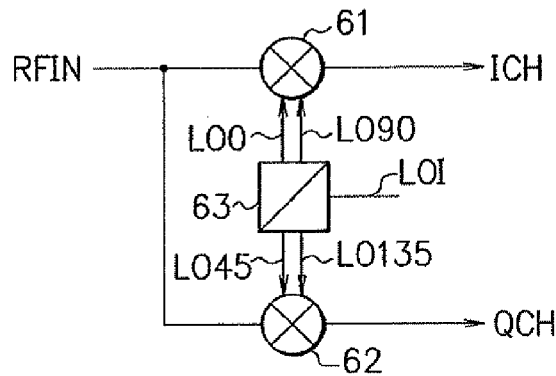
FIG. 11 is a diagram showing a configuration of an even harmonic mixer.
Figure 12:
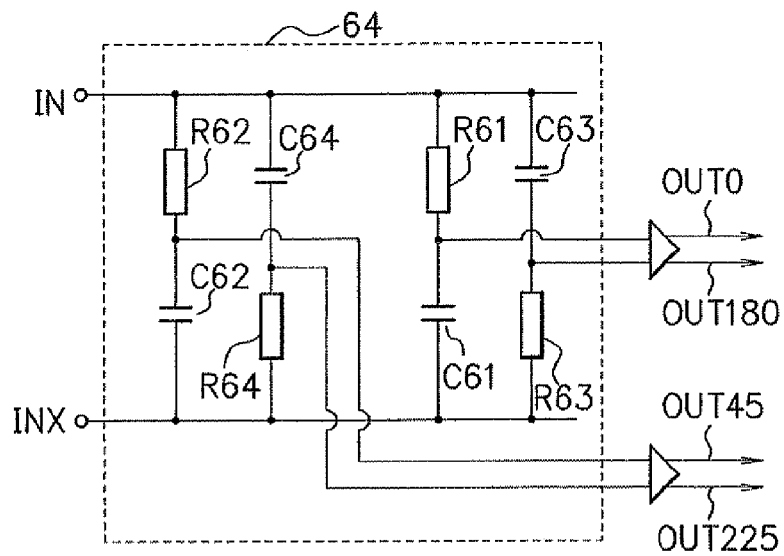
FIG. 12 is a diagram showing a configuration of a primary CR-type 45° phase shifter.
Figure 13:
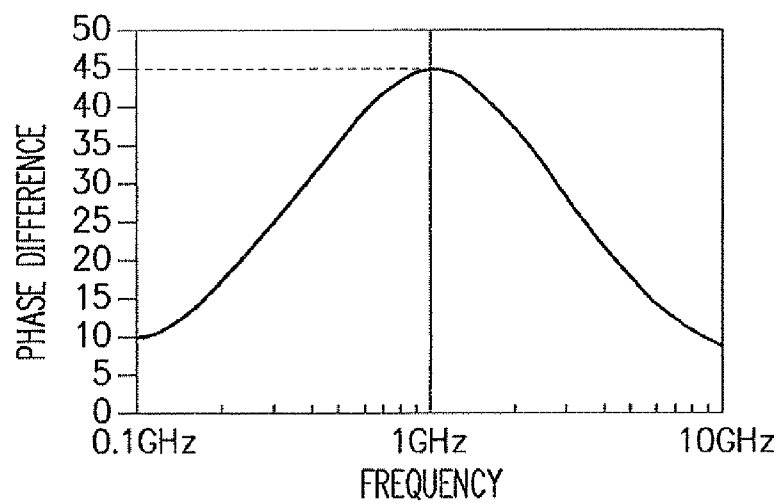
FIG. 13 is a chart showing an example of a frequency characteristic of a 45° phase shifter shown in FIG. 12.

FIG. 10 is a diagram showing a configuration example of a 45° phase shift circuit in the second embodiment of the present invention. The 45° phase shift circuit in the second embodiment has a 45° phase shifter 41, 90° phase shifters 42, 43, 90° phase correctors 44, 45, and a 45° phase corrector 46.

The 45° phase shifter 41 is a primary CR-type 45° phase shifter constituted of a CR network, in which circuits each constituted of one resistor Ri and one capacitor Ci (i=any integer out of 41-44) connected in series are connected in parallel between signal lines through which differential input signals IN, INX are inputted.

The 45° phase shifter 41 receives the differential input signals IN, INX to output a 0° signal SF0, a 45° signal SF45, a 180°signal SF180, and a 225° signal SF225 which are supposed to have 0°, 45°, 180°, and 225° relative phase differences respectively. Incidentally, resistance values of the resistors R41~R44 and capacitance values of the capacitors C41~C44 are appropriately set according to a center frequency. Here, the resistance values of the resistors R41 and R43 are equal to each other and the resistance values of the resistors R42 and R44 are equal to each other. The capacitance values of the capacitors C41 and C43 are equal to each other and the capacitance values of the capacitors C42 and C44 are equal to each other.

The 90° phase shifter 42 performs 90° phase shift of the 0° signal SF0 and the 180° signal SF180 inputted from the 45° phase shifter 41 via a buffer circuit 47. Then, the 90° phase shifter 42 outputs a 0° signal SG0, a 90° signal SG90, a 180° signal SG180, and a 270° signal SG270 resulting from the 90° phase shift.

The 90° phase corrector 44 receives the signals SG0, SG90, SG180, and SG270 outputted from the 90° phase shifter 42. The 90° phase corrector 44 performs 90° phase correction by using these inputted signals (for example, at lest one of a set of the 0° signal SG0 and the 90° signal SG90 and a set of the 180° signal SG180 and the 270° signal SG270 each supposed to have a 90° phase difference), and outputs a 0° signal SH0, a 90° signal SH90, a 180° signal SH180, and a 270° signal SH270 resulting from the 90° phase correction.

Similarly, the 90° phase shifter 43 and the 90° phase corrector 45 perform 90° phase shift and 90° phase correction respectively on the 45° signal SF45 and the 225° signal SF225 inputted from the 45° phase shifter 41 via a buffer circuit 48, so that a 45° signal SH45, a 135° signal SH135, a 225° signal SH225, and a 315° signal SH315 resulting from the 90° phase shift and the 90° phase correction are outputted.

Incidentally, the 90° phase shifter 42 (43) and the 90° phase corrector 44 (45) can be structured by using a known 90° phase shifter disclosed in, for example, Japanese Patent Application Laid-open No. Hei 5-110369, Japanese Patent Application Laid-open No. Hei 7-303028, and so on.

The 45° phase corrector 46 performs 45° phase correction in which a phase difference of signals supposed to have a 45° relative phase difference, out of the signals supplied from the 90° phase correctors 44, 45, is corrected to accurately 45°. The 45° phase corrector 46 has a plurality of adders 49 and limiter amplifiers 50 provided in correspondence to the adders 49, which have the same configurations as those shown in FIG. 8 and FIG. 9 described above.

Concretely, each of the adders 49 performs an addition operation (vector synthesis) of an m° signal SHm and an (m+45)° signal SH(m+45) (m is 0, 45, 90, 135, 180, 225, 270, or 315). Then, output signals of the adders 49 are inputted to the limiter amplifiers 50, where amplitude limiting for eliminating amplitude errors is performed. In this manner, the 45° phase corrector 46 outputs signals SJ0, SJ45, SJ90, SJ135, SJ180, SJ225, SJ270, and SJ315 resulting from the 45° phase correction and having a mutual phase difference of accurately 45°.

As described above, according to the second embodiment, the same effects as those of the first embodiment can be obtained, and since each constituent circuit of the 45° phase shift circuit in the second embodiment has a differential structure, the influence of unnecessary signals such as noise can be reduced.

Moreover, if either of the 45° phase shift circuits in the first and second embodiments is used as the phase shifters that supply the local oscillation signals to the down converters of the aforesaid even harmonic mixer, it is possible to supply the down converters with two orthogonal phase signals having a phase difference of accurately 45°, resulting in improved performance of the even harmonic mixer, which can greatly contribute to the realization of a high-quality and low-cost communication system.

Further, a circuit in a typical LSI generally has a differential structure so as to be free from the influence of unnecessary signals even if they are inputted, but each circuit in the 45° phase shift circuits in the above-described first and second embodiments may have a differential structure or may have a single-end structure.

Further, the above-described embodiments are all only examples of embodiments for carrying out the present invention, and these examples should not be considered as limiting the technical scope of the present invention. That is, the present invention can be implemented in various forms without departing from its technical ideas or its essential features.

INDUSTRIAL APPLICABILITY

The present invention includes a 45° phase corrector that performs vector synthesis of signals supposed to have a 45° phase difference, out of a plurality of sets of orthogonal phase signals having an about 45° phase difference and an equal amplitude, the orthogonal phase signals in each set having undergone 90° phase correction, and outputs signals generated by the vector synthesis, and therefore, the 45° phase correction by the vector synthesis can eliminate a phase error between the orthogonal phase signals in the different sets, so that it is possible to output the signals whose phase difference is corrected to accurately 45°.

What is claimed is:

1. A phase shift circuit comprising a 45° phase corrector that is supplied with a plurality of sets of orthogonal phase signals in which each set consists of respective first and second orthogonal phase signals, each having undergone a 90° phase correction and which have an about 45° phase difference and an equal amplitude, relative to respective first and second orthogonal phase signals of a different set of the plurality of sets of orthogonal phase signals, and that performs vector synthesis of signals supposed to have a 45° phase difference, out of the supplied sets of orthogonal phase signals, to output signals resulting from the vector synthesis.

2. The phase shift circuit according to claim 1, wherein said 45° phase corrector performs amplitude correction to correct an amplitude error of the signals resulting from the vector synthesis.

3. The phase shift circuit according to claim 1, further comprising respective 90° phase correctors that perform the 90° phase correction of the respective sets of orthogonal phase signals, each set consisting of first and second orthogonal phase signals, to supply the resultant signals to said 45° phase corrector.

4. The phase shift circuit according to claim 3, further comprising a phase shifter that phase-shifts an input signal by an integral multiple of 45° and supplies output signals generated by the phase shifter to said 90° phase correctors.

5. The phase shift circuit according to claim 4, wherein said phase shifter supplies said 90° phase corrector with at least 4-phase signals having successive, relative phase differences of about 0°, about 450°, about 90°, and about 135°.

6. The phase shift circuit according to claim 5, wherein said phase shifter supplies said 90° phase corrector with 8-phase signals including reverse-phase signals of the respective 4-phase signals.

7. The phase shift circuit according to claim 3, further comprising:
a 45° phase shifter that phase-shifts a differential input signal by 45°; and
a 90° phase shifter that phase-shifts an output signal of said 45° phase shifter by 90° and supplies said 90° phase corrector with signals generated by the phase shifter.

8. The phase shift circuit according to claim 3, further comprising:
a 45° phase shifter that phase-shifts an input signal to generate first and second sets of output signals having an about 45° phase difference;
a first 90° phase shifter that phase-shifts the first output signal to generate a third and a fourth output signal having an about 90° phase difference; and
a second 90° phase shifter that phase-shifts the second output signal to generate a fifth and a sixth output signal having an about 90° phase difference,
wherein the third, fourth, fifth, and sixth output signals are supplied to said 90° phase corrector.

9. The phase shift circuit according to claim 3, wherein said 45° phase corrector has a plurality of adders each adding signals supposed to have a 45° phase difference, out of the orthogonal phase signals having undergone the 90° phase correction.

10. The phase shift circuit according to claim 9, wherein said 45° phase corrector further has a limiter amplifier performing amplitude limiting of output signals of the adders.

11. The phase shift circuit according to claim 9, wherein said 90° phase corrector comprises:
an adder performing addition and subtraction of the two signals constituting each set of the orthogonal phase signals; and
a limiter amplifier performing amplitude limiting of an output signal of the adder.

12. The phase shift circuit according to claim 4, wherein said phase shifter has a plurality of circuits each constituted of a resistor and a capacitor connected in series, and the plural circuits are connected in parallel to a signal line through which the input signal is supplied.

13. A phase shift circuit comprising a plurality of first adders each of which receives two signals supposed to have a 45° phase difference, out of a plurality of sets of orthogonal phase signals having an about 45° phase difference and an equal amplitude, relative to respective first and second orthogonal phase signals of a different set of the plurality of sets of orthogonal phase signals, the orthogonal phase signals in each set having undergone a 90° phase correction, and adds the two signals to output an addition result.

14. The phase shift circuit according to claim 13, further comprising a first limiter amplifier that is constituted of multi-stage amplifiers connected to one another and receiving the outputs of said first adders.

15. The phase shift circuit according to claim 14, further comprising:
- a second adder that receives two signals constituting orthogonal phase signals and outputs a sum signal of the two signals;
- a third adder that receives the two signals constituting the orthogonal phase signals and outputs a difference signal of the two signals; and
- a second limiter amplifier that is constituted of multi-stage amplifiers connected to one another and receives the outputs of said second and third adders to supply output signals to said first adders.

16. A phase correcting method, comprising:
- a 45° correction step of performing vector synthesis of signals supposed to have a 45° phase difference, out of a plurality of sets of supplied orthogonal phase signals having an about 45° phase difference and an equal amplitude, relative to respective first and second orthogonal phase signals of a different set of the plurality of sets of orthogonal phase signals, the orthogonal phase signals in each set having undergone 90° phase correction, to generate signals having a 45° phase difference.

17. The phase correcting method according to claim 16, further comprising an amplitude correction step of performing amplitude correction of the signals generated in said 45° correction step.

18. The phase correcting method according to claim 16, further comprising a 90° correction step of generating the orthogonal phase signals with a 90° phase difference used in said 45° correction step by using two signals constituting orthogonal phase signals.

* * * * *

UNITED STATES PATENT AND TRADEMARK OFFICE
CERTIFICATE OF CORRECTION

PATENT NO.       : 7,443,220 B2                                    Page 1 of 1
APPLICATION NO.  : 11/602320
DATED            : October 28, 2008
INVENTOR(S)      : Kazuhiro Tomita It is certified that error appears in the above-identified patent and that said Letters Patent is hereby corrected as shown below:

Column 12, Line 14, change "450°," to --45°,--.

Signed and Sealed this

Sixth Day of January, 2009

JON W. DUDAS
*Director of the United States Patent and Trademark Office*